(12) United States Patent
Chang Chien et al.

(10) Patent No.: US 11,545,423 B2
(45) Date of Patent: Jan. 3, 2023

(54) PACKAGE STRUCTURE AND MANUFACTURING METHOD THEREOF

(71) Applicant: Powertech Technology Inc., Hsinchu County (TW)

(72) Inventors: Shang-Yu Chang Chien, Hsinchu County (TW); Nan-Chun Lin, Hsinchu County (TW); Hung-Hsin Hsu, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 16/952,044

(22) Filed: Nov. 18, 2020

(65) Prior Publication Data

US 2021/0202363 A1 Jul. 1, 2021

Related U.S. Application Data

(60) Provisional application No. 62/955,456, filed on Dec. 31, 2019.

(30) Foreign Application Priority Data

Oct. 13, 2020 (TW) .................................. 109135315

(51) Int. Cl.
*H01L 23/498* (2006.01)
*H01L 21/56* (2006.01)
(Continued)

(52) U.S. Cl.
CPC .... *H01L 23/49833* (2013.01); *H01L 21/4857* (2013.01); *H01L 21/56* (2013.01);
(Continued)

(58) Field of Classification Search
None
See application file for complete search history.

(56) References Cited

U.S. PATENT DOCUMENTS

2019/0158096 A1* 5/2019 Tang ........................ H01L 24/16
2020/0058632 A1* 2/2020 Chen ..................... H01L 25/105
(Continued)

FOREIGN PATENT DOCUMENTS

CN 110137088 8/2019
JP 2006165106 6/2006
(Continued)

OTHER PUBLICATIONS

"Office Action of Taiwan Counterpart Application", dated Dec. 3, 2020, p. 1-p. 9.
(Continued)

*Primary Examiner* — Jay C Chang
(74) *Attorney, Agent, or Firm* — JCIPRNET

(57) ABSTRACT

The disclosure provides a package structure including a redistribution circuit structure, a first circuit board, a second circuit board, a first insulator, multiple conductive terminals, and a package. The redistribution circuit structure has a first connection surface and a second connection surface opposite to each other. The first circuit board and the second circuit board are disposed on the first connection surface and are connected electrically to the redistribution circuit structure. The first insulator is disposed on the first connection surface and covers the first circuit board and the second circuit board. The conductive terminals are connected electrically to and disposed on the first circuit board or the second circuit board. The package is disposed on the second connection surface and is connected electrically to the redistribution circuit structure. A manufacturing method of a package structure is also provided.

14 Claims, 12 Drawing Sheets

(51) Int. Cl.
*H01L 23/053* (2006.01)
*H01L 23/00* (2006.01)
*H01L 21/48* (2006.01)
*H01L 23/31* (2006.01)

(52) U.S. Cl.
CPC ........ *H01L 23/053* (2013.01); *H01L 23/3128* (2013.01); *H01L 23/49816* (2013.01); *H01L 23/49822* (2013.01); *H01L 23/562* (2013.01)

(56) References Cited

U.S. PATENT DOCUMENTS

2020/0161266 A1* 5/2020 Shim .................... H01L 21/6836
2021/0175163 A1* 6/2021 Fang ..................... H01L 21/561

FOREIGN PATENT DOCUMENTS

| JP | 2008270362 | 11/2008 |
|----|------------|---------|
| TW | 201916191 | 4/2019 |
| TW | 201916304 | 4/2019 |
| TW | 201919134 | 5/2019 |
| TW | 201935582 | 9/2019 |

OTHER PUBLICATIONS

"Office Action of China Counterpart Application", dated Sep. 30, 2022, p. 1-p. 8.

* cited by examiner

PACKAGE STRUCTURE AND MANUFACTURING METHOD THEREOF

CROSS-REFERENCE TO RELATED APPLICATION

This application claims the priority benefit of U.S. Provisional Application No. 62/955,456, filed on Dec. 31, 2019, and Taiwan Application No. 109135315, filed on Oct. 13, 2020. The entirety of each of the above-mentioned patent applications is hereby incorporated by reference herein and made a part of this specification.

BACKGROUND

Technical Field

The disclosure relates to a package structure and a manufacturing method thereof, especially a package structure including multiple chips and multiple circuit boards and a manufacturing method thereof.

Description of Related Art

Electronic devices have come to occupy a vital position in our everyday live. To accelerate the integration of different functions, multiple active chips are integrated into a package structure. Therefore, it has become an urgent issue at hand to improve the manufacturing yield or quality of the package structure having multiple active chips, or to reduce the manufacturing cost of the package structure having multiple active chips.

SUMMARY

The present disclosure provides a package structure having better quality.

The present disclosure also provides a manufacturing method of a package structure, having better yield or lower cost.

The package structure of the present disclosure includes a redistribution circuit structure, a first circuit board, a second circuit board, a first insulator, multiple conductive terminals, and a package. The redistribution circuit structure has a first connection surface and a second connection surface opposite to each other. The first circuit board is disposed on the first connection surface and is connected electrically to the redistribution circuit structure. The second circuit board is disposed on the first connection surface and is connected electrically to the redistribution circuit structure. The first insulator is disposed on the first connection surface and covers the first circuit board and the second circuit board. The conductive terminals are disposed on the first circuit board or the second circuit board, and the conductive terminals are connected electrically to the first circuit board or the second circuit board. The package is disposed on the second connection surface and is connected electrically to the redistribution circuit structure. The package includes at least one chip, a encapsulant, a line layer, and multiple conductive package terminals. The encapsulant encapsulates the chip. The line layer is located on the encapsulant and is connected electrically to the chip. The conductive package terminals are located on the line layer and are connected electrically to the redistribution circuit structure.

The manufacturing method of a package structure of the present disclosure includes the following steps: forming a redistribution circuit structure having a first connection surface and a second connection surface opposite to each other; disposing the first circuit board on the first connection surface, and connecting the first circuit board electrically to the redistribution circuit structure; disposing the second circuit board on the first connection surface, and connecting the second circuit board electrically to the redistribution circuit structure; forming the first insulator on the first connection surface, and covering the first insulator onto the first circuit board and the second circuit board; forming multiple conductive terminals on the first circuit board or the second circuit board, and connecting multiple conductive terminals electrically to the first circuit board or the second circuit board; and disposing the package on the second connection surface, in which the package is connected electrically to the redistribution circuit structure. The package includes at least one chip, a encapsulant, a line layer, and multiple conductive package terminals. The encapsulant encapsulates the chip. The line layer is located on the encapsulant and is connected electrically to the chip. The conductive package terminals are located on the line layer and are connected electrically to the redistribution circuit structure.

Based on the above, by disposing multiple circuit boards on the redistribution circuit structure in a package structure having multiple chips, the manufacturing method of the package structure becomes simpler and/or the cost may be lowered. In addition, the overall circuit layout of the package structure reduces the load of the redistribution circuit structure, and thereby improving the quality of the package structure.

DESCRIPTION OF THE EMBODIMENTS

Figure 1A:
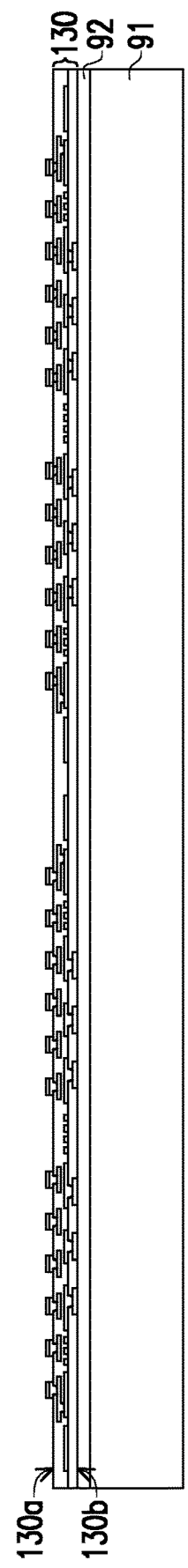
FIG. 1A to FIG. 1F are partial schematic cross-sectional views of part of a manufacturing method of a package structure according to the first embodiment of the present disclosure.

Directional terms used herein (for example, up, down, right, left, front, back, top, and bottom) are only used as a reference for the drawing and are not intended to imply the absolute orientation. In addition, for the sake of clarity, some layers or components may be omitted in the drawings.

Unless specified otherwise, the steps in the method described herein shall not be interpreted to be executed in a specific order.

Please refer to the drawings of the embodiments for a more comprehension elaboration. However, the present disclosure may also be embodied in various forms and are not limited to the embodiments and their drawings described herein. The relative thickness, size, and location of each layer, region, and/or structure in the drawings may be reduced or enlarged for clarity. Same or similar reference numbers represent the same or similar elements, and repeated description thereof is not provided hereinafter.

FIG. 1A to FIG. 1F are partial schematic cross-sectional views of part of a manufacturing method of a package structure according to a first embodiment of the present disclosure. FIG. 1G is a partial schematic top view of a package structure according to the first embodiment of the present disclosure.

In FIG. 1A, a redistribution circuit structure 130 is formed. For example, a commonly used semiconductor manufacturing process may be used to form the redistribution circuit structure 130 on a carrier 91. The carrier 91 may be made of glass, wafer substrate, metal, or other suitable materials, as long as the aforementioned materials are able to carry the structures or components formed thereon in the subsequent manufacturing process.

In this embodiment, the redistribution circuit structure 130 may have a first connection surface 130a and a second connection surface 130b. The second connection surface 130b is opposite to the first connection surface 130a, and the second connection surface 130b faces the carrier 91.

In this embodiment, the carrier 91 may have a release layer 92. The release layer 92 may be a light to heat conversion (LTHC) adhesive layer, but the disclosure is not limited thereto.

Figure 1B:
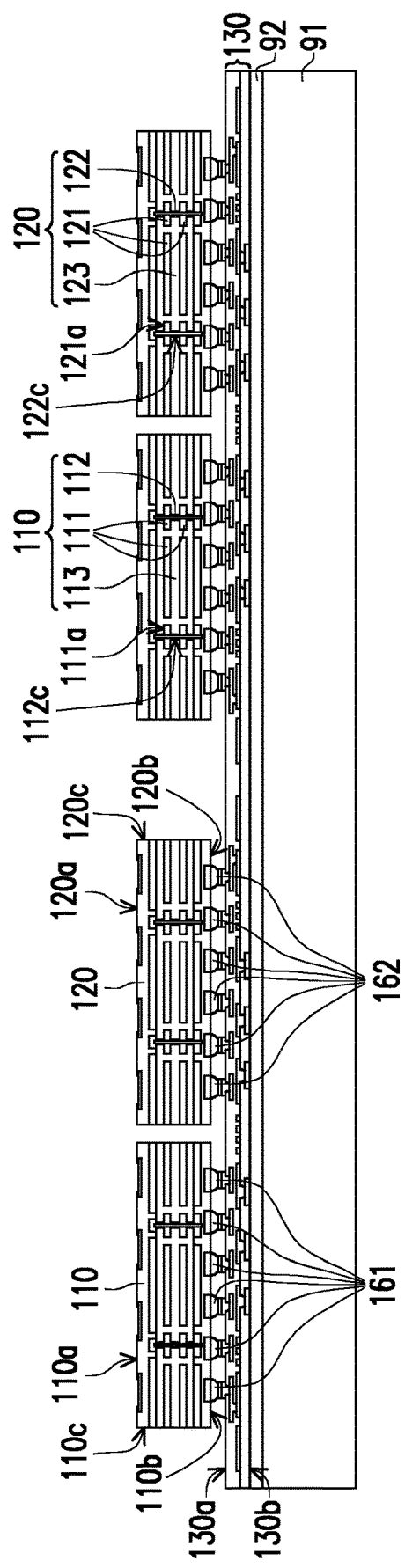

In FIG. 1B, the first circuit board 110 is disposed on the redistribution circuit structure 130, and the first circuit board 110 is connected electrically to the corresponding circuit in the redistribution circuit structure 130. The first circuit board 110 has a first top surface 110a, a first bottom surface 110b, and a first side surface 110c. The first bottom surface 110b is opposite to the first top surface 110a. The first side surface 110c is connected to the first top surface 110a and the first bottom surface 110b. The first circuit board 110 may be disposed on the first connection surface 130a of the redistribution circuit structure 130 by having its first bottom surface 110b face the first connection surface 130a of the redistribution circuit structure 130.

In this embodiment, the first circuit board 110 may be a Si-substrate-free circuit board. For example, the insulating material 113 in the first circuit board 110 may include, for example, an epoxy prepreg sheet, an aramid prepreg sheet, or other similar polymer prepreg sheets.

In an embodiment, the first circuit board 110 may include a plurality of line layers 111 and a plurality of conductive microvias 112 located between the line layers 111. In one embodiment, a sidewall 112c of the conductive microvia 112 is substantially perpendicular to a surface 111a of the connected line layer 111.

In an embodiment, the first circuit board 110 may be a high density interconnect substrate (HDI substrate).

In this embodiment, the first circuit board 110 may be connected electrically to the corresponding circuit in the redistribution circuit structure 130 through corresponding first conductive connectors 161.

In an embodiment, the first conductive connector 161 may include a conductive pillar, a solder ball, a conductive bump, or a conductive connector in any other forms or shapes. The first conductive connector 161 may be formed and disposed on the first circuit board 110 by electroplating, deposition, ball placement, reflow, and/or other suitable processes.

In an embodiment not illustrated herein, a filling layer may be formed between the first circuit board 110 and the redistribution circuit structure 130, but the present disclosure is not limited thereto. The filling layer may be, for example, Capillary Underfill (CUF) or other suitable filling materials, but the present disclosure is not limited thereto.

It is worth noting that in FIG. 1B, only two first circuit boards 110 are shown for exemplary purposes, but the present disclosure does not limit the number of the first circuit board(s) 110 disposed on the first connection surface 130a.

In FIG. 1B, the second circuit board 120 is disposed on the redistribution circuit structure 130, and the second circuit board 120 is connected electrically to the corresponding circuit in the redistribution circuit structure 130. The second circuit board 120 has a second top surface 120a, a second bottom surface 120b, and a second side surface 120c. The second bottom surface 120b is opposite to the second top surface 120a. The second side surface 120c is connected to the second top surface 120a and the second bottom surface 120b. The second circuit board 120 may be disposed on the first connection surface 130a of the redistribution circuit structure 130 by having its second bottom surface 120b face the first connection surface 130a of the redistribution circuit structure 130.

In this embodiment, the second circuit board 120 may be a Si-substrate-free circuit board. For example, the insulating material 123 in the second circuit board 120 may include, for example, an epoxy prepreg sheet, an aramid prepreg sheet, or other similar polymer prepreg sheets.

In an embodiment, the second circuit board 120 may include a plurality of line layers 121 and a plurality of conductive microvias 122 located between the line layers 121. In one embodiment, a sidewall 122c of the conductive microvia 122 is substantially perpendicular to a surface 121a of the connected line layer 121.

In an embodiment, the second circuit board 120 may be a high density interconnect substrate (HDI substrate).

In this embodiment, the second circuit board 120 may be connected electrically to the corresponding circuit in the redistribution circuit structure 130 through corresponding second conductive connectors 162.

In an embodiment, the second conductive connector 162 may include a conductive pillar, a solder ball, a conductive bump, or a conductive connector in any other forms or shapes. The second conductive connector 162 may be formed and disposed on the second circuit board 120 by electroplating, deposition, ball placement, reflow, and/or other suitable processes.

In an embodiment not illustrated herein, a filling layer may be formed between the second circuit board 120 and the redistribution circuit structure 130, but the present disclosure is not limited thereto. The filling layer may be, for example, Capillary Underfill (CUF) or other suitable filling materials, but the present disclosure is not limited thereto.

It is worth noting that in FIG. 1B, only two second circuit boards 120 are shown for exemplary purposes, but the present disclosure does not limit the number of second first circuit board(s) 120 disposed on the first connection surface 130a.

It should be noted that, the present disclosure is not limited to the configuration and order of the first circuit board 110 and the second circuit board 120.

In one embodiment, before disposing the first circuit board 110 and the second circuit board 120 on the redistribution circuit structure 130, the redistribution circuit structure 130 may be subjected to an electrical test, such as Open/Short test (O/S test), appearance inspection, such as Auto Optical Inspection (AOI), or other suitable inspections or tests. In this way, the redistribution circuit structure 130 is confirmed to be functioning well, and the yield of the package structure 100 (marked in FIG. 1F or FIG. 1G) is improved.

In an embodiment, the first circuit board 110 and/or the second circuit board 120 configured on the redistribution circuit structure 130 may be a known good substrate (KGS). For example, before disposing the first circuit board 110 and/or the second circuit board 120 on the redistribution circuit structure 130, the first circuit board 110 and/or the second circuit board 120 may be subjected to electrical tests, such as Open/Short test (O/S test), appearance inspection, such as Auto Optical Inspection (AOI), or other suitable inspections or tests. In this way, the first circuit board 110 and/or the second circuit board 120 disposed on the redistribution circuit structure 130 are confirmed to be functioning well, and the yield of the package structure 100 (marked in FIG. 1F or FIG. 1G) is improved.

In one embodiment, after disposing the circuit board (at least one of the first circuit board 110 and the second circuit board 120) on the redistribution circuit structure 130, the circuit board may be subjected to electrical tests, such as Open/Short test (O/S test), appearance inspection, such as Auto Optical Inspection (AOI), or other suitable inspections or tests. In one embodiment, after the foregoing inspections or tests are performed, if the aforementioned circuit boards need to be inspected or tested again, undergone re-work steps, and/or scrapped, since there are multiple circuit boards configured on the redistribution circuit structure 130, a specific circuit board may undergo the tests, the re-working, and/or being scrapped after its removal independently. By doing so, the steps are rendered relatively simple, and/or the cost becomes relatively low.

Figure 1C:
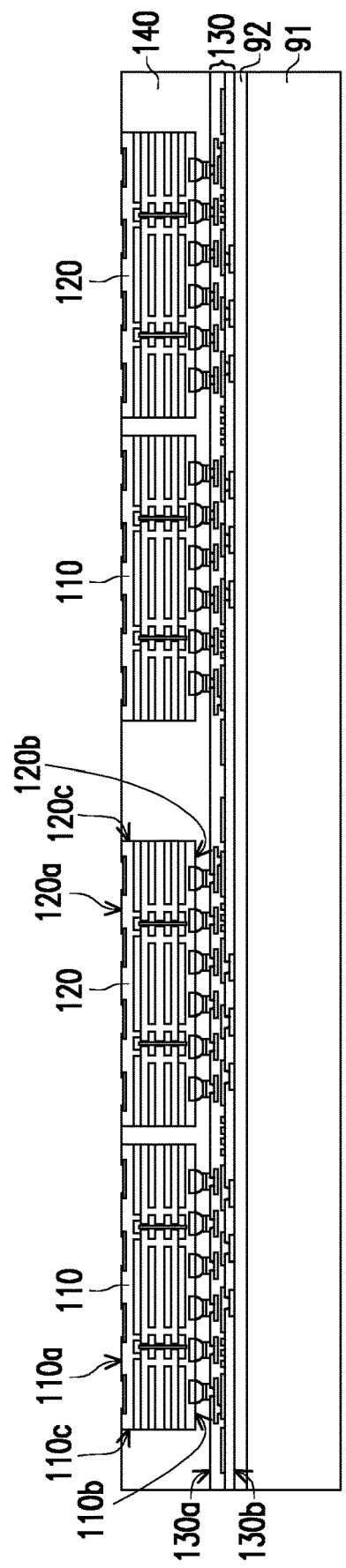

In FIG. 1C, a first insulator 140 may be formed on the first connection surface 130a of the redistribution circuit structure 130. The first insulator 140 may cover the first circuit board 110 and the second circuit board 120, and the first insulator 140 may expose part of the first circuit board 110 and part of the second circuit board 120.

In an embodiment, the first insulator 140 may be formed of a molding material. For example, a molding material covering the first circuit board 110 and the second circuit board 120 may be formed. In one embodiment, the molding material is formed by a molding process or other suitable methods to form a molten molding compound on the first connection surface 130a of the redistribution circuit structure 130. Then, the molten molding compound is cooled and solidified. In one embodiment, the first insulator 140 is formed by at least the above steps.

In this embodiment, the first insulator 140 at least covers laterally the first circuit board 110 and the second circuit board 120. In an embodiment, the first insulator 140 at least directly contacts the first side surface 110c of the first circuit board 110 and the second side surface 120c of the second circuit board 120. In one embodiment, part of the first insulator 140 is located between the first circuit board 110 and the second circuit board 120. In an embodiment, the first insulator 140 exposes the first top surface 110a of the first circuit board 110 and the second top surface 120a of the second circuit board 120.

In one embodiment, part of the first insulator 140 may be further located between the first circuit board 110 and the redistribution circuit structure 130. In an embodiment, part of the first insulator 140 located between the first circuit board 110 and the redistribution circuit structure 130 may further directly contact the first bottom surface 110b of the first circuit board 110.

In this embodiment, part of the first insulator 140 may be further located between the second circuit board 120 and the redistribution circuit structure 130. In an embodiment, part of the first insulator 140 located between the second circuit board 120 and the redistribution circuit structure 130 may further directly contact the second bottom surface 120b of the second circuit board 120.

Figure 1D:
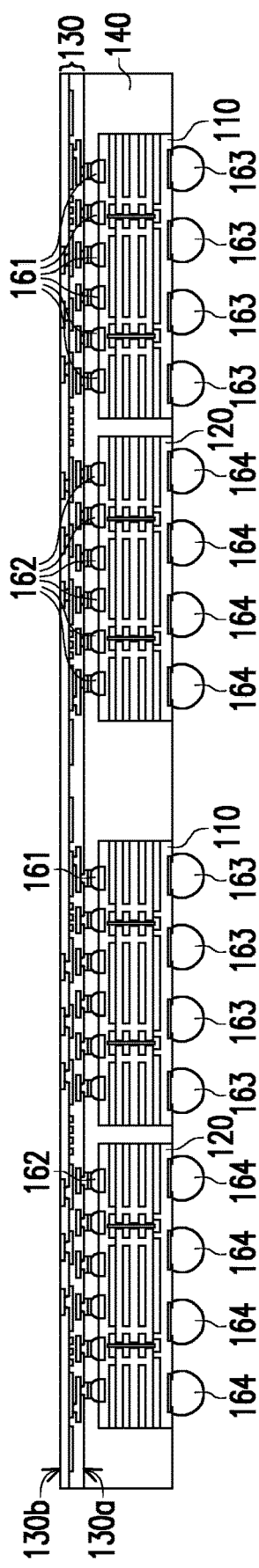

In FIG. 1C to FIG. 1D, the carrier 91 (marked in FIG. 1C) is removed, exposing the second connection surface 130b of the redistribution circuit structure 130.

In FIG. 1D, the first conductive terminal 163 is disposed on the first circuit board 110, and the first conductive terminal 163 is connected electrically to the corresponding circuit on the first circuit board 110.

In FIG. 1D, the second conductive terminal 164 is disposed on the second circuit board 120, and the second conductive terminal 164 is connected electrically to the corresponding circuit on the second circuit board 120.

In this embodiment, the first conductive terminal 163 or the second conductive terminal 164 may be a solder ball or a conductive connector in any other forms or shapes. The first conductive terminal 163 or the second conductive terminal 164 may be formed by ball placement, reflow, and/or other suitable processes.

Note that the present disclosure does not limit the sequence of removing the carrier 91, configuring the first conductive terminal 163, and configuring the second conductive terminal 164.

Figure 1E:
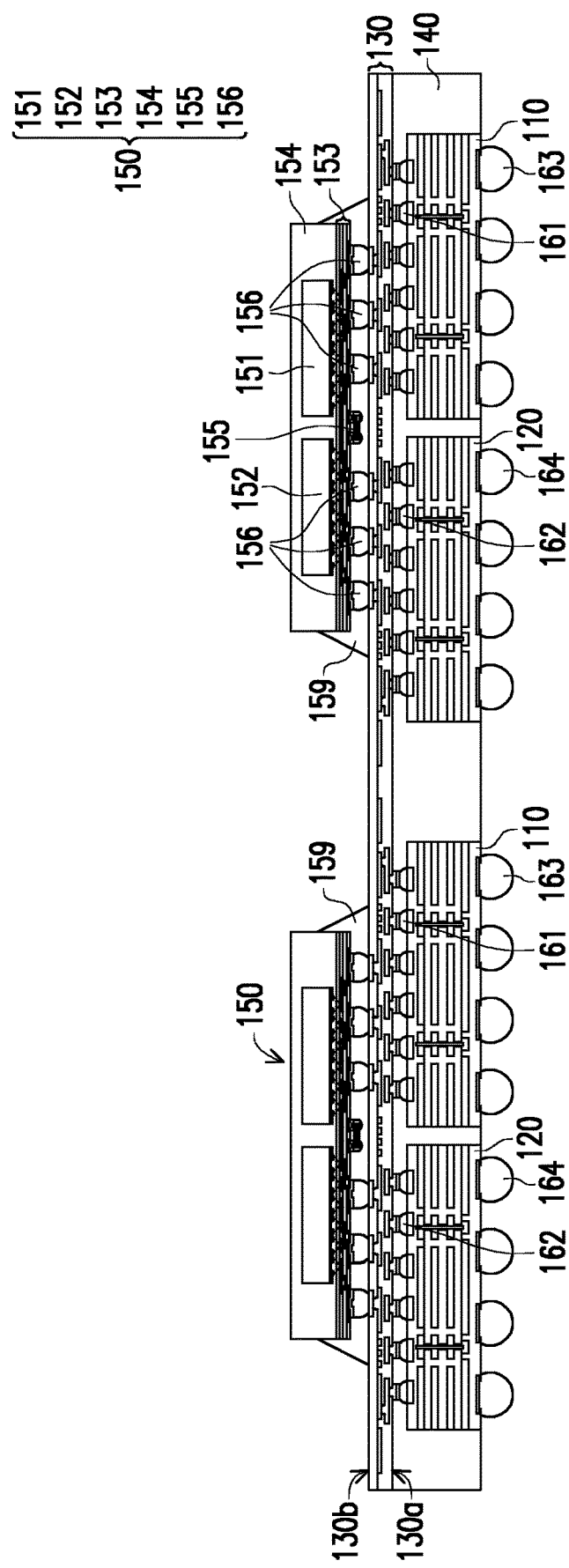

In FIG. 1E, a package 150 is disposed on the second connection surface 130b of the redistribution circuit structure 130, and the package 150 is connected electrically to the corresponding circuit in the redistribution circuit structure 130.

The package 150 includes a first chip 151, a second chip 152, a encapsulant 154, a line layer 153, and a plurality of conductive package terminals 156. The encapsulant 154 covers the first chip 151 and the second chip 152. The line layer 153 is located on the encapsulant 154. The first chip 151 is connected electrically to the corresponding circuit in the line layer 153. The second chip 152 is connected electrically to the corresponding circuit in the line layer 153. The conductive package terminals 156 are located on the line layer 153 and are connected electrically to the corresponding circuit in the line layer 153. The first chip 151 is connected electrically to the corresponding circuit in the redistribution circuit structure 130 through the corresponding circuit and the corresponding conductive package terminals 156 of the line layer 153. The second chip 152 is connected electrically to the corresponding circuit in the redistribution circuit structure 130 through the corresponding circuit and the corresponding conductive package terminals 156 of the line layer 153.

In this embodiment, the chips included in the package 150 are the first chip 151 and the second chip 152 which are laid forth as examples, but the disclosure is not limited thereto. In an embodiment, there may be only one chip in the package 150 (for example, one of the first chip 151 or the second chip 152). In an embodiment, the chip in the package 150 may further include other chips that are the same or similar to the first chip 151 or the second chip 152.

In this embodiment, the package 150 may further include an electronic component 155. The electronic component 155 may be disposed on the line layer 153 and on a side opposite to the first chip 151 and the second chip 152. The electronic component 155 is connected electrically to the corresponding circuit in the line layer 153. In an embodiment, the electronic component 155 may be a passive component, but the disclosure is not limited thereto.

In an embodiment, the first chip 151 or the second chip 152 may be a power management integrated circuit (PMIC), a micro-electro-mechanical-system (MEMS), an application-specific integrated circuit (ASIC), a dynamic random access memory chip (DRAM), a static random access memory chip (SRAM), a high bandwidth memory (HBM) chip, a system-on-a-chip (SoC), or other similar high performance computing (HPC) chips, but the present disclosure is not limited thereto.

In an embodiment, the first chip 151 and the second chip 152 may be homogeneous or heterogeneous, which is not limited in the present disclosure.

In an embodiment, the package 150 may be a fan-out package, a wafer level chip scale package (WLCSP), or a flip chip chip scale package (FCCSP), Window BGA package (wBGA package), or other suitable packages, which is not limited in the present disclosure.

In an embodiment, the package 150 configured on the redistribution circuit structure 130 may be a known good package (KGP). For example, before disposing the package 150 on the redistribution circuit structure 130, the package 150 may be subjected to electrical tests, such as Open/Short test (O/S test), appearance inspection, such as Auto Optical Inspection (AOI), or other suitable inspections or tests. In this way, the package 150 disposed on the redistribution circuit structure 130 is confirmed to be functioning well, and the yield of the package structure 100 (marked in FIG. 1F or FIG. 1G) is improved.

In this embodiment, the step of configuring the package 150 may be performed after the step of configuring the first circuit board 110 and the step of configuring the second circuit board 120.

In this embodiment, a filling layer 159 may be formed between the package 150 and the redistribution circuit structure 130, but the disclosure is not limited thereto. The filling layer 159 may be, for example, Capillary Underfill (CUF) or other suitable filling materials, but the present disclosure is not limited thereto.

It is worth noting that in FIG. 1E, only two packages 150 are shown for exemplary purposes, but the present disclosure does not limit the number of the package(s) 150 disposed on the second connection surface 130b.

Figure 1F:
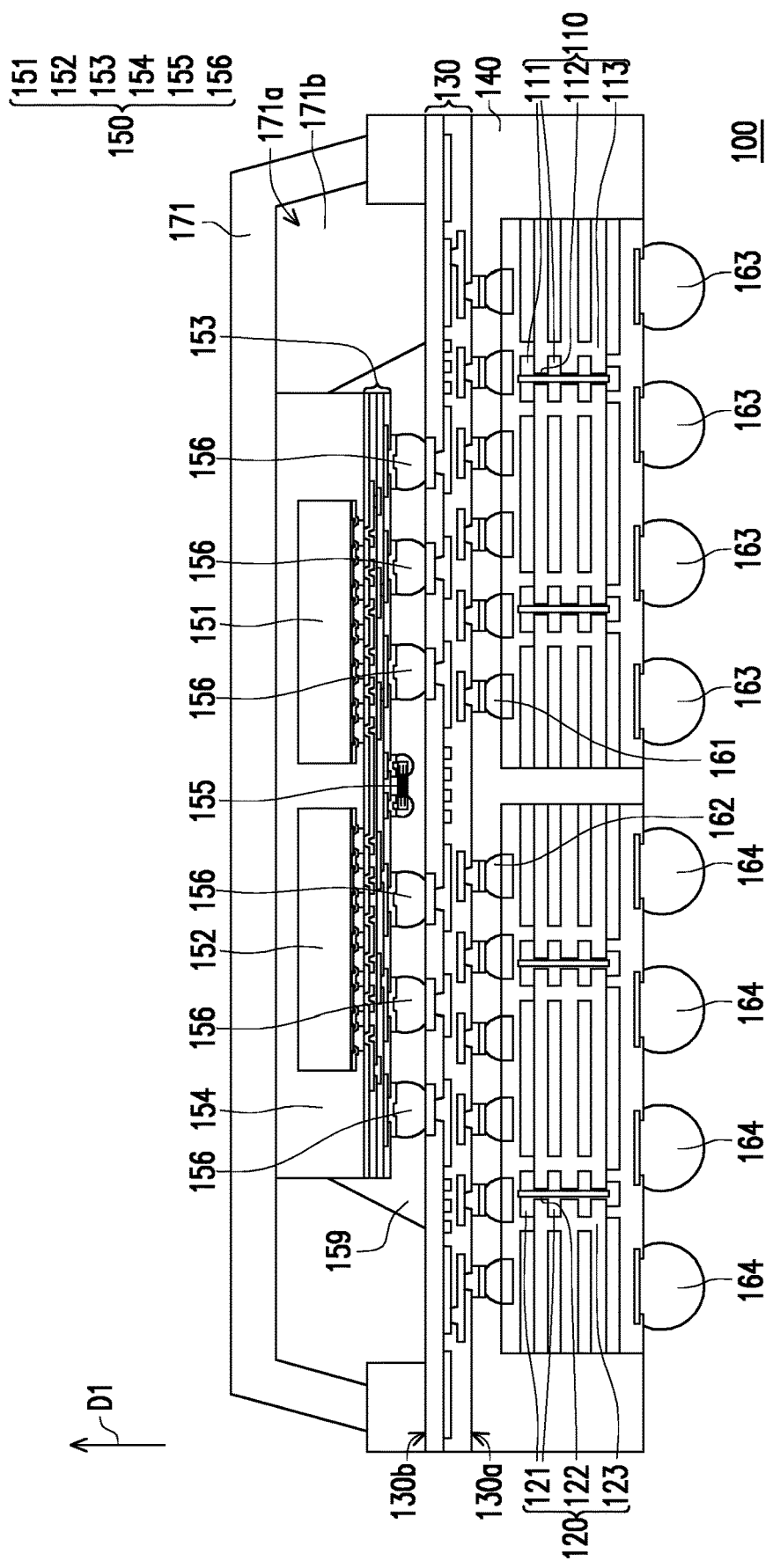
Figure 1G:
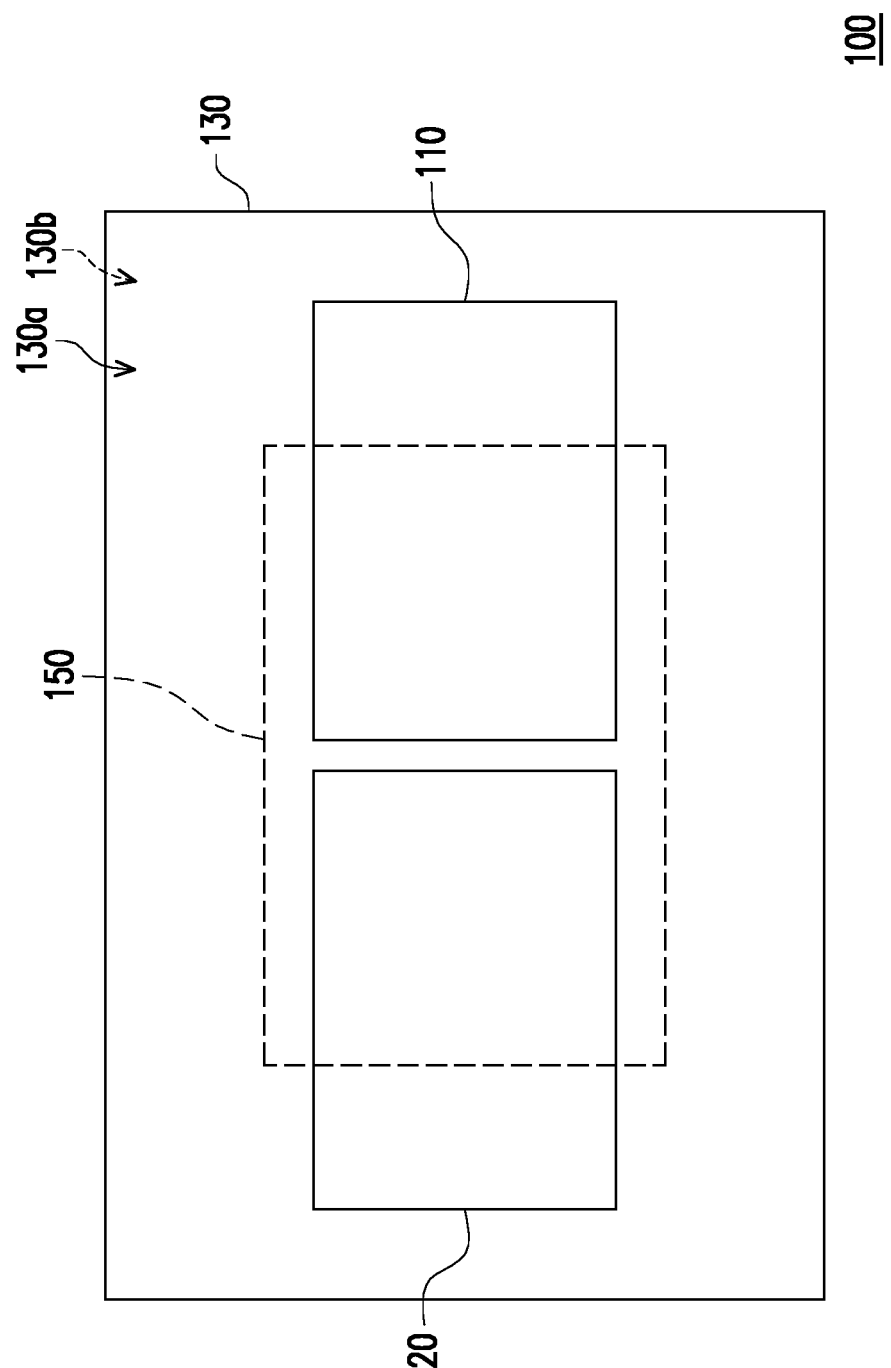
FIG. 1G is a partial schematic top view of a package structure according to the first embodiment of the present disclosure.

In FIG. 1E to FIG. 1F, in this embodiment, a singulation process may be adapted to form the package structures 100. The singulation process may include, for example, a dicing process/cutting process, to at least cut through the redistribution circuit structure 130 and the first insulator 140.

It is worth noting that after the singulation process, similar component symbols are used for the singulated components. For example, the redistribution circuit structure 130 (as shown in FIG. 1E) after singulation may be the redistribution circuit structure 130 (as shown in FIG. 1F); the first circuit board 110 (as shown in FIG. 1E) after singulation may be the first circuit board 110 (as shown in FIG. 1F); the second circuit board 120 (as shown in FIG. 1E) after singulation may be the second circuit board 120 (as shown in FIG. 1F); the first insulator 140 (as shown in FIG. 1E) after singulation may be the first insulator 140 (as shown in FIG. 1F); the conductive terminals 163 and 164 (as shown in FIG. 1E) after singulation may be the conductive terminals 163 and 164 (as shown in FIG. 1F); the package 150 (as shown in FIG. 1E) after singulation may be the package 150 (as shown in FIG. 1F), and so on. Other singularized components follow the same component-symbol rule as described above, and will not be repeated or particularly illustrated herein.

In FIG. 1F, in this embodiment, a housing 171 may be disposed on the second connection surface 130b of the redistribution circuit structure 130. The housing 171 may be directly or indirectly connected to the redistribution circuit structure 130. For example, the housing 171 may be embedded in the redistribution circuit structure 130, and the housing 171 may be directly connected to the redistribution circuit structure 130. For another example, there may be an adhesive material between the housing 171 and the redistribution circuit structure 130, such that the housing 171 may be indirectly connected to the redistribution circuit structure 130.

Note that the present disclosure is not limited to the configuration and order of the singulation process (if any) or the configuration of the housing 171 (if any).

After performing the foregoing steps, the manufacturing of the package structure 100 of this embodiment is generally completed.

In FIG. 1F and FIG. 1G, the package structure 100 includes the redistribution circuit structure 130, the first circuit board 110, the second circuit board 120, the first insulator 140, the conductive terminals 163 and 164, and the package 150. The redistribution circuit structure 130 has the first connection surface 130a and the second connection surface 130b. The second connection surface 130b is opposite to the first connection surface 130a. The first circuit board 110 is disposed on the first connection surface 130a of the redistribution circuit structure 130 and is connected electrically to the redistribution circuit structure 130. The second circuit board 120 is disposed on the first connection surface 130a of the redistribution circuit structure 130 and is connected electrically to the redistribution circuit structure 130. The first insulator 140 is disposed on the first connection surface 130a of the redistribution circuit structure 130 and covers the first circuit board 110 and the second circuit board 120. The conductive terminal may include the first conductive terminal 163 or the second conductive terminal 164. The first conductive terminal 163 may be disposed on the first circuit board 110 and be connected electrically to the first circuit board 110. The second conductive terminal 164 may be disposed on the second circuit board 120 and be connected electrically to the second circuit board 120. The package 150 includes the first chip 151, the second chip 152, the encapsulant 154, the line layer 153, and the conductive package terminals 156. The package 150 is disposed on the second connection surface 130b of the redistribution circuit structure 130 and is connected electrically to the redistribution circuit structure 130.

In this embodiment, the first connection surface 130a and the second connection surface 130b of the redistribution circuit structure 130 are substantially parallel, but the disclosure is not limited to this.

In this embodiment, in a projection direction D1 which is perpendicular to the first connection surface 130a or the second connection surface 130b, the first circuit board 110 and the second circuit board 120 do not overlap with each other. In an embodiment, the first circuit board 110 and the second circuit board 120 may be disposed side by side.

In this embodiment, in the projection direction D1 perpendicular to the first connection surface 130a or the second connection surface 130b, the first circuit board 110 and the second circuit board 120 completely overlap the redistribution circuit structure 130.

In this embodiment, the package 100 may further include the housing 171. The housing 171 is disposed on the second connection surface 130*b* of the redistribution circuit structure 130. The housing 171 has an accommodation space 171*a*, and the package 150 is located in the accommodation space 171*a*.

In an embodiment, the housing 171 may include a hard material. Such design may protect the components (such as the package 150) in the housing 171.

In an embodiment, the housing 171 may include a conductive material. In a possible embodiment, the conductive housing 171 is adapted as electromagnetic interference shielding (EMI shielding) to reduce the electromagnetic interference, but the present disclosure is not limited thereto. In a possible embodiment, the conductive part of the housing 171 may be adapted as an antenna, but the present disclosure is not limited to this.

In an embodiment, the housing 171 may include a thermally conductive material. The thermally conductive housing 171 may be thermally coupled to the package 150.

In this embodiment, there may be an airgap 171*b* between the housing 171 and the package 150.

In this embodiment, in the package structure 100 having a package 150 including multiple chips (e.g., the first chip 151 and the second chip 152), the multiple chips (e.g., the first chip 151 and the second chip 152) rely on the corresponding circuit for power or signal transmission, and each chip is connected to the outside through the corresponding circuit for power or signal transmission (for example, the first chip 151 and the second chip 152 are connected to the external electronic components connected to the conductive terminals 163 and 164 through the corresponding circuit boards 110 and 120). Therefore, by disposing multiple circuit boards (e.g., the first circuit board 110 and the second circuit board 120), the manufacturing method of the package structure 100 becomes simpler and/or the cost may be lowered. In addition, the overall circuit layout of the package structure 100 may reduce the load of the redistribution circuit structure 130 and/or the line layer 153 of the package 150 (for example, the number of the conductive layer in the redistribution circuit structure 130 and/or the line layer 153 may be reduced, and the optimization of the wire width, wire pitch, and/or wire layout of the conductive layer in the redistribution circuit structure 130 and/or the line layer 153 becomes easier). By doing so, the quality of the package structure 100 is improved.

In this embodiment, by adapting multiple circuit boards (such as the first circuit board 110 and the second circuit board 120) and the redistribution circuit structure 130, the circuits of the package structure 100 may be disposed to corresponding circuit boards (such as the first circuit board 110 and the second circuit board 120) and/or the redistribution circuit structure 130 according to the design needs. Such configuration allows the wires to be disposed suitably. In addition, compared to the configuration of disposing the wires together on a single circuit board, the single circuit board may need to have a larger size or more conductive layers. Therefore, the aforementioned cost of disposing a single circuit board may be higher and/or have a lower yield. Therefore, by providing multiple circuit boards (e.g., the first circuit board 110 and the second circuit board 120), the manufacturing method of the package structure 100 may become simpler and/or have a lower cost.

Figure 2:
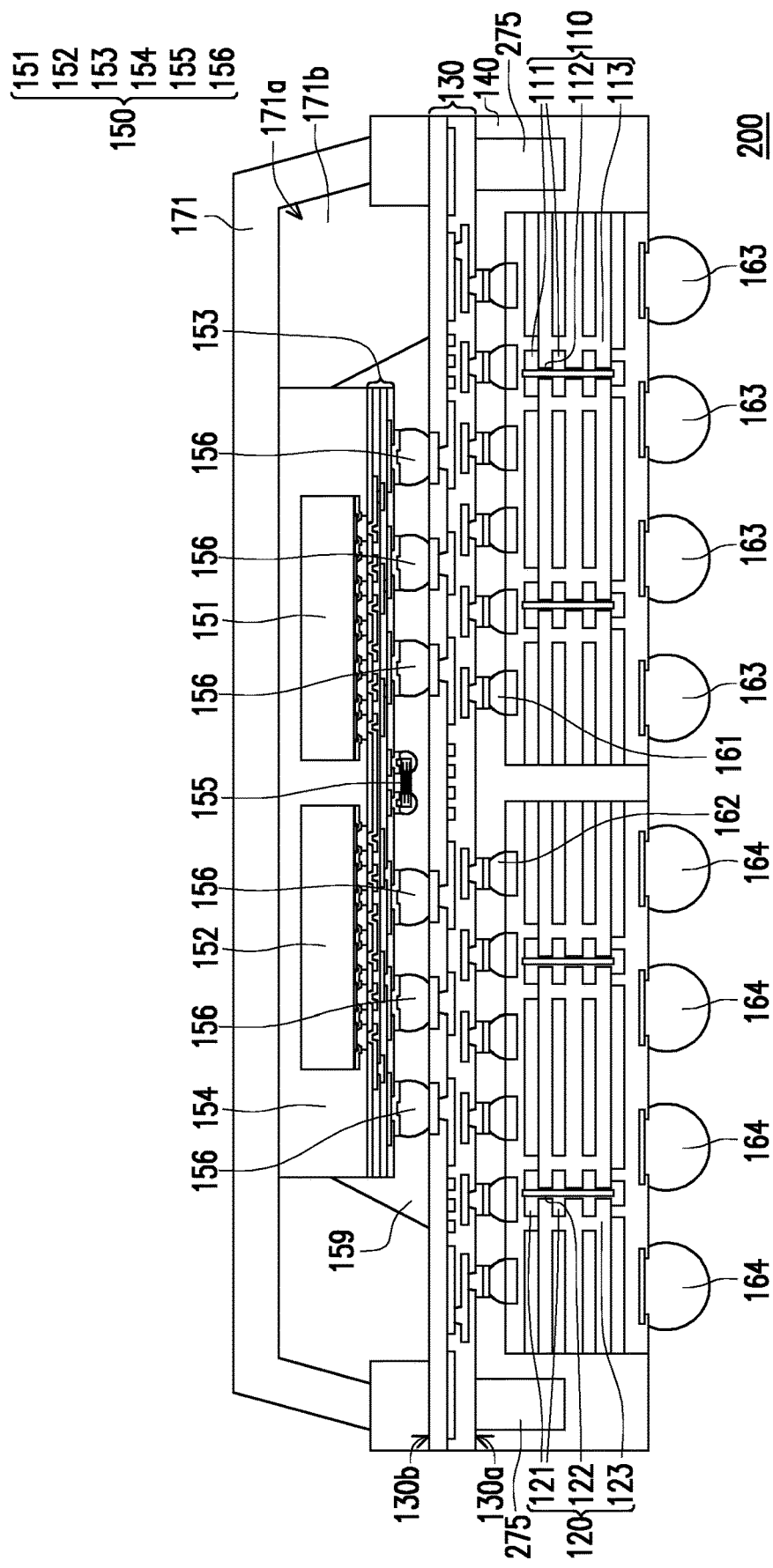
FIG. 2 is a partial schematic cross-sectional view of a package structure according to the second embodiment of the present disclosure.

FIG. 2 is a partial schematic cross-sectional view of a package structure according to the second embodiment of the present disclosure. The manufacturing method of a package structure 200 of the second embodiment is similar to the manufacturing method of the package structure 100 of the first embodiment. Similar components are represented by the same reference numerals. The descriptions of the components having similar functions, materials or formation methods are omitted hereinafter.

In this embodiment, the package structure 200 may include a redistribution circuit structure 130, a first circuit board 110, a second circuit board 120, a first insulator 140, a plurality of conductive terminals 163 and 164, a package 150, and a stiffening support 275. The stiffening support 275 may be located on the redistribution circuit structure 130 on the first connection surface 130*a*. The first insulator 140 may cover the stiffening support 275.

In an embodiment, the stiffening support 275 may include a supporting die. For example, ugly die, failed die, or other dummy dies may be adapted as the supporting die. By doing so, the manufacturing cost may be reduced.

In an embodiment, the stiffening support 275 may include a hard support ring. For example, the stiffening support 275 may include a ring-shaped metal strip. In an embodiment, the stiffening support 275 may be termed a stiffener ring.

In an embodiment, the stiffening support 275 may reduce the structural warpage.

Figure 3:
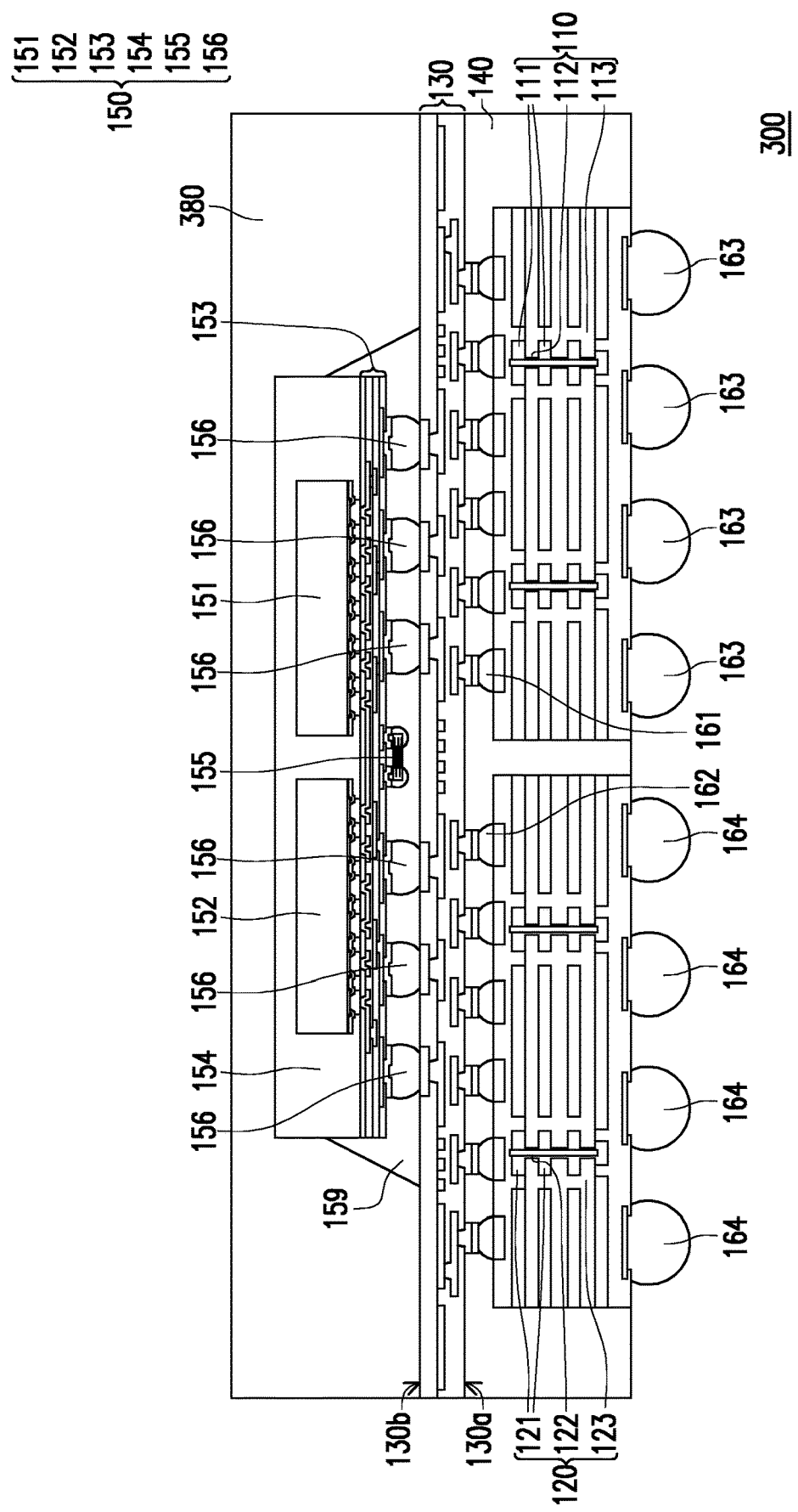
FIG. 3 is a partial schematic cross-sectional view of a package structure according to the third embodiment of the present disclosure.

FIG. 3 is a partial schematic cross-sectional view of a package structure according to the third embodiment of the present disclosure. The manufacturing method of a package structure 300 of the third embodiment is similar to the manufacturing method of the package structure 100 of the first embodiment. Similar components are represented by the same reference numerals. The descriptions of the components having similar functions, materials or formation methods are omitted hereinafter.

In this embodiment, the package structure 300 may include a redistribution circuit structure 130, a first circuit board 110, a second circuit board 120, a first insulator 140, a plurality of conductive terminals 163 and 164, a package 150, and a second insulator 380. The second insulator 380 may be located on the second connection surface 130*b* of the redistribution circuit structure 130. The second insulator 380 may cover the package 150.

The material and the formation of the second insulator 380 may be the same with or similar to that of the first insulator 140, and thus the descriptions are omitted herein.

Figure 4A:
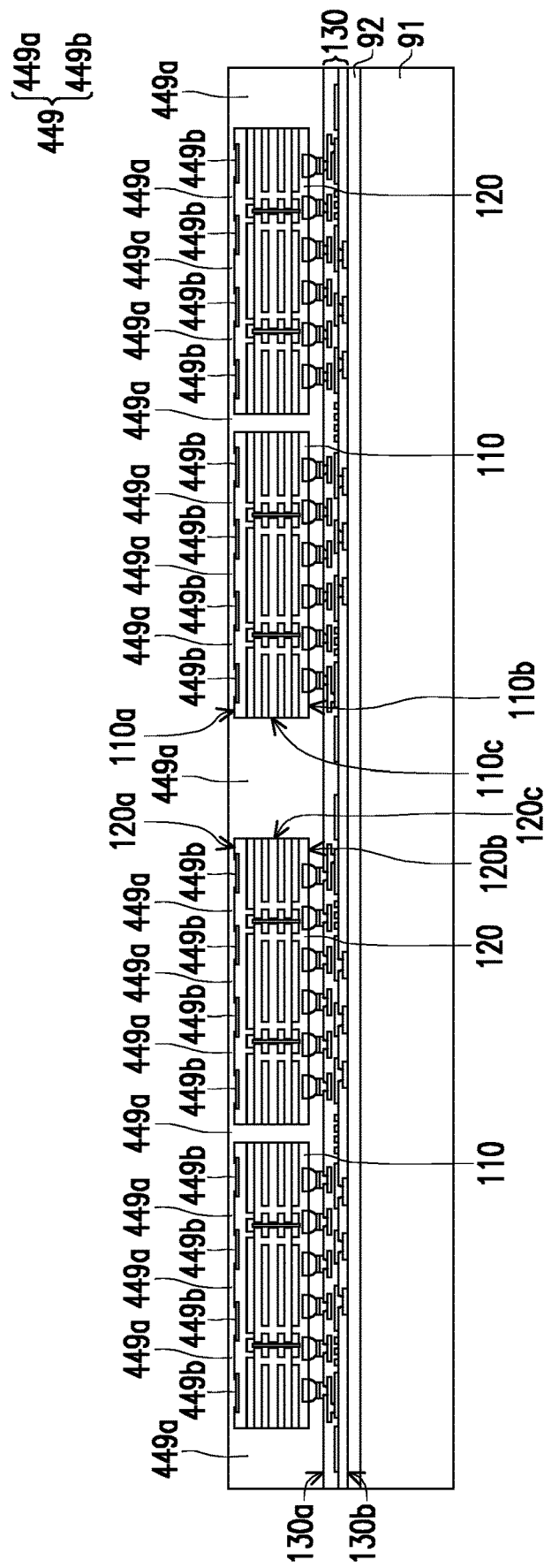
FIG. 4A to FIG. 4C are partial schematic cross-sectional views of part of a manufacturing method of a package structure according to the fourth embodiment of the present disclosure.
Figure 4B:
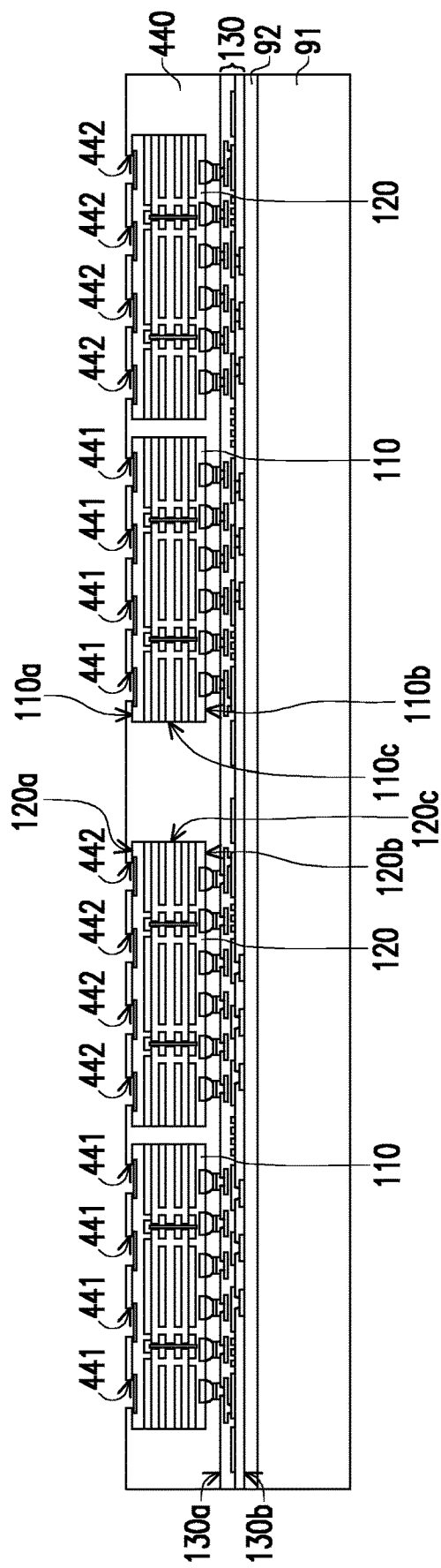
Figure 4C:
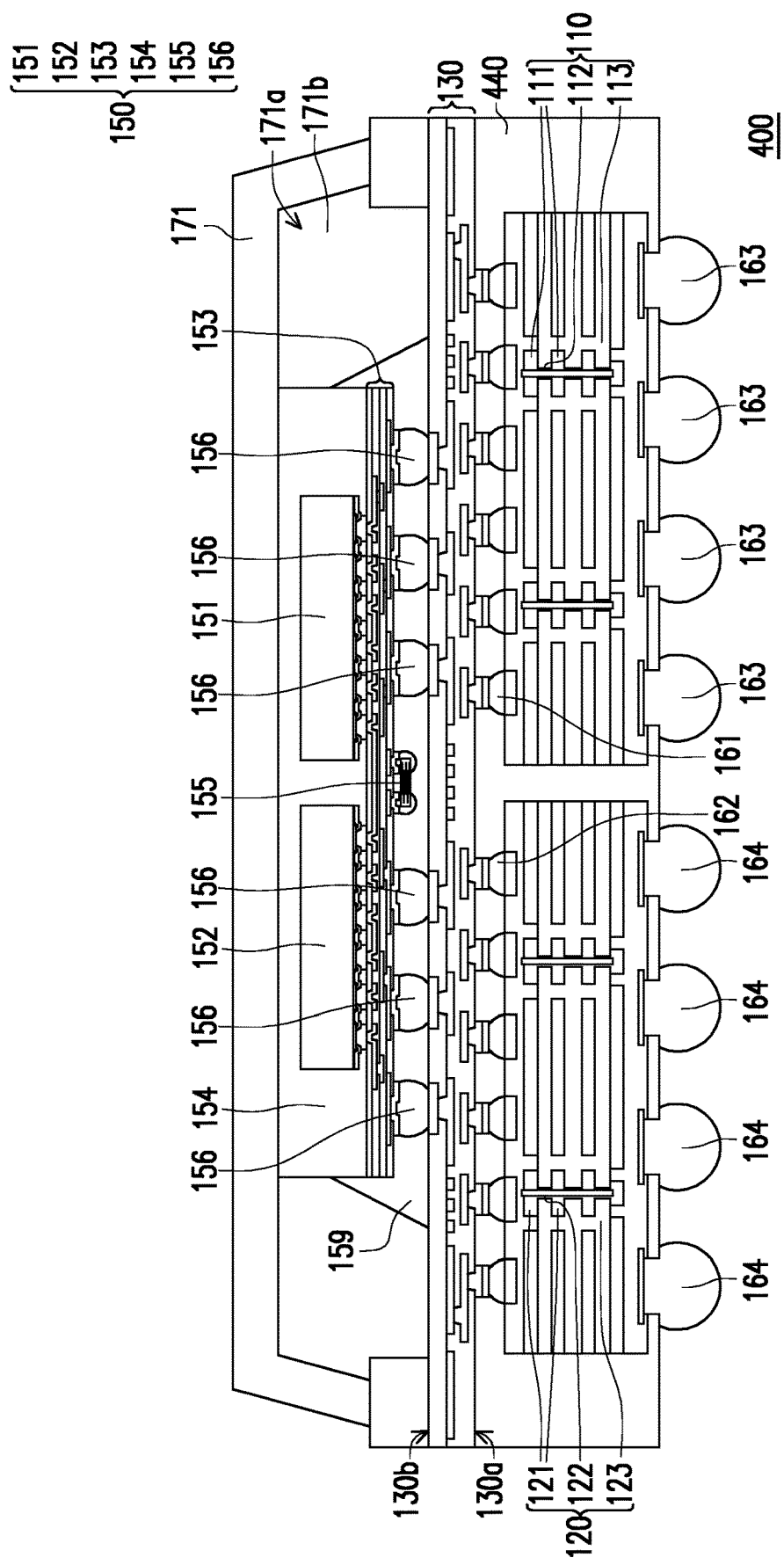

FIG. 4A to FIG. 4C are partial schematic cross-sectional views of part of a manufacturing method of a package structure according to the fourth embodiment of the present disclosure. The manufacturing method of a package structure 400 of the fourth embodiment is similar to the manufacturing method of the package structure 100 of the first embodiment. Similar components are represented by the same reference numerals. The descriptions of the components having similar functions, materials or formation methods are omitted hereinafter.

Proceeding from FIG. 1B and now to FIG. 4A, in this embodiment, a photoimageable dielectric (PID) material 449 may be formed on a first connection surface 130*a* of a redistribution circuit structure 130. The PID material 449 may cover the first top surface 110*a*, a first bottom surface 110*b*, and a first side surface 110*c* of a first circuit board 110. The PID material 449 may cover a second top surface 120*a*, a second bottom surface 120*b*, and a second side surface 120*c* of a second circuit board 120. In an embodiment, the PID material 449 may be formed by coating or other suitable processes, but the present disclosure is not limited thereto. In an embodiment, the PID material 449 may directly contact the first top surface 110*a*, the first bottom surface 110*b*, and the first side surface 110*c* of the first circuit board 110. In an embodiment, the PID material 449 may directly contact the second top surface 120a, the second bottom surface 120b, and the second side surface 120c.

In FIG. 4A to FIG. 4B, part of the PID material 449 is cured. And after curing part of the PID material 449, rest of the PID material 449 where hasn't been cured may be removed.

For example, the PID material 449 (marked in FIG. 4A) may have a first insulating portion 449a (marked in FIG. 4A) and a second insulating portion 449b (marked in FIG. 4A). Part of the first insulating portion 449a may be cured by photopolymerization and/or baking. Then, the uncured second insulating portion 449b may be removed by wet cleaning or other suitable ways, so that the cured first insulating portion 449a is patterned to form a first insulator 440 (marked in FIG. 4B) having a plurality of first insulating openings 441 (marked in FIG. 4B) and a plurality of second insulating openings 442 (marked in FIG. 4B). The first insulator 440 may cover a first bottom surface 110b, a first side surface 110c, and part of a first top surface 110a of a first circuit board 110. The first insulator 440 may cover a second bottom surface 120b, a second side surface 120c, and part of a second top surface 120a of a second circuit board 120. The first insulating openings 441 may expose at least part of the conductive layer located on the first top surface 110a. The second insulating openings 442 may expose at least part of the conductive layer located on the second top surface 120a.

In FIG. 4B to FIG. 4C, the package structure 400 of this embodiment is formed by the same or similar steps as shown in FIG. 1D to FIG. 1F.

For example, a plurality of first conductive terminals 163 may be disposed on the first circuit board 110. The first conductive terminals 163 are be embedded in the first insulating openings 441 of the first insulator 440 and are connected electrically to the corresponding circuits in the first circuit board 110.

For example, a plurality of first conductive terminals 164 may be disposed on the second circuit board 120. The second conductive terminals 164 are be embedded in the second insulating openings 442 of the first insulator 440 and are connected electrically to the corresponding circuits in the second circuit board 120.

After performing the foregoing steps, the manufacturing of the package structure 400 of this embodiment is generally completed.

In FIG. 4C, the package structure 400 includes the redistribution circuit structure 130, the first circuit board 110, the second circuit board 120, the first insulator 440, the conductive terminals 163 and 164, and the package 150. The first insulator 440 is disposed on the first connection surface 130a of the redistribution circuit structure 130 and covers the first circuit board 110 and the second circuit board 120.

In this embodiment, part of the first insulator 440 may cover the first top surface 110a of the first circuit board 110.

In this embodiment, part of the first insulator 440 may cover the second top surface 120a of the second circuit board 120.

In summary, in the package structure having a package including multiple chips (e.g., the first chip and the second chip), the multiple chips (e.g., the first chip and the second chip) rely on the corresponding circuit for power or signal transmission, and each chip is connected to the outside through the corresponding circuit for power or signal transmission (for example, the first chip and the second chip are connected to the external electronic components connected to the conductive terminals and through the corresponding circuit boards). Therefore, by disposing multiple circuit boards (e.g., the first circuit board and the second circuit board), the manufacturing method of the package structure becomes simpler and/or the cost may be lowered. Furthermore, the overall circuit layout of the package structure may reduce the load of the redistribution circuit structure and/or the line layer of the package (for example, the number of the conductive layer in the redistribution circuit structure 130 and/or the line layer 153 may be reduced, and the optimization of the wire width, wire pitch, and/or wire layout of the conductive layer in the redistribution circuit structure 130 and/or the line layer 153 becomes easier). By doing so, the quality of the package structure is improved.

What is claimed is:

1. A package structure, comprising:
   a redistribution circuit structure, comprising a first connection surface and a second connection surface opposite to the first connection surface;
   a first circuit board, disposed on the first connection surface and connected electrically to the redistribution circuit structure;
   a second circuit board, disposed on the first connection surface and connected electrically to the redistribution circuit structure;
   a first insulator, located on the first connection surface and covering the first circuit board and the second circuit board;
   a plurality of conductive terminals, disposed on the first circuit board or the second circuit board, and connected electrically to the first circuit board or the second circuit board;
   a package, disposed on the second connection surface and connected electrically to the redistribution circuit structure, the package comprising:
   at least one chip;
   an encapsulant, encapsulating the at least one chip;
   a line layer, located on the encapsulant and connected electrically to the at least one chip; and
   a plurality of conductive package terminals, located on the line layer and connected electrically to the redistribution circuit structure; and
   a housing, disposed on the second connection surface and comprising an accommodation space, wherein the package is located in the accommodation space, and an airgap exists between the housing and the package.

2. The package structure according to claim 1, wherein the first circuit board and the second circuit board are Si-substrate-free circuit boards.

3. The package structure according to claim 1, wherein in a projection direction perpendicular to the first connection surface or the second connection surface, the first circuit board and the second circuit board do not overlap with each other.

4. The package structure according to claim 3, wherein in the projection direction, the first circuit board and the second circuit board fully overlap with the redistribution circuit structure.

5. The package structure according to claim 1, further comprising:
   a plurality of conductive connectors, disposed on the first circuit board or the second circuit board, wherein the first circuit board or the second circuit board is connected electrically to the redistribution circuit structure via the corresponding conductive connectors.

6. The package structure according to claim 5, wherein part of the first insulator is located between the first circuit board and the redistribution circuit structure, or between the second circuit board and the redistribution circuit structure.

7. The package structure according to claim 1, further comprising:
   a second insulator, disposed on the second connection surface and covering the package.

8. The package structure according to claim 1, further comprising:
   a stiffening support, disposed on the first connection surface, wherein the first insulator covers the stiffening support.

9. The package structure according to claim 1, wherein part of the first insulator is located between the first circuit board and the second circuit board.

10. The package structure according to claim 9, wherein:
   the first circuit board comprises a first top surface and a first bottom surface, wherein the first bottom surface is opposite to the first top surface, and the first bottom surface faces the redistribution circuit structure;
   the second circuit board comprises a second top surface and a second bottom surface, wherein the second bottom surface is opposite to the second top surface, and the second bottom surface faces the redistribution circuit structure; and
   part of the first insulator covers the first top surface or the second top surface.

11. A manufacturing method of a package structure, comprising:
   forming a redistribution circuit structure comprising a first connection surface and a second connection surface opposite to the first connection surface;
   disposing a first circuit board on the first connection surface, and connecting the first circuit board electrically to the redistribution circuit structure;
   disposing a second circuit board on the first connection surface, and connecting the second circuit board electrically to the redistribution circuit structure;
   forming a first insulator on the first connection surface, and adapting the first insulator to cover the first circuit board and the second circuit board;
   forming a plurality of conductive terminals on the first circuit board or the second circuit board, and connecting the conductive terminals electrically to the first circuit board or the second circuit board;
   disposing a package on the second connection surface, and connecting the package electrically to the redistribution circuit structure, wherein the package comprises:
      at least one chip;
      an encapsulant, encapsulating the at least one chip;
      a line layer, located on the encapsulant and connected electrically to the at least one chip; and
      a plurality of conductive package terminals, located on and connected electrically to the redistribution circuit structure; and
   disposing a housing on the second connection surface, wherein the housing comprising an accommodation space, the package is located in the accommodation space, and an airgap exists between the housing and the package.

12. The manufacturing method of the package structure according to claim 11, wherein disposing the package is performed after disposing the first circuit board and disposing the second circuit board.

13. The manufacturing method of the package structure according to claim 11, further comprising:
   before disposing the first circuit board and disposing the second circuit board, subjecting the redistribution circuit structure to an inspection or a test; or
   before forming the first insulator, subjecting the first circuit board or the second circuit board to an inspection or a test.

14. The manufacturing method of the package structure according to claim 11, wherein forming the first insulator comprises:
   forming on the first connection surface a photoimageable dielectric material covering the first circuit board and the second circuit board, wherein the photoimageable dielectric material comprises a first insulating portion and a second insulating portion;
   curing the first insulating portion; and
   after curing the first insulating portion, removing the second insulating portion, and exposing part of the first circuit board and part of the second circuit board.

* * * * *